(12) United States Patent
Kim et al.

(10) Patent No.: US 7,078,949 B2
(45) Date of Patent: Jul. 18, 2006

(54) ANALOG DELAY LOCKED LOOP HAVING DUTY CYCLE CORRECTION CIRCUIT

(75) Inventors: Se-Jun Kim, Ichon-shi (KR); Sang-Hoon Hong, Ichon-shi (KR); Jae-Bum Ko, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 105 days.

(21) Appl. No.: 10/750,243

(22) Filed: Dec. 31, 2003

(65) Prior Publication Data

US 2004/0155686 A1 Aug. 12, 2004

(30) Foreign Application Priority Data

Jan. 10, 2003 (KR) ................. 10-2003-0001729

(51) Int. Cl.
*H03L 7/06* (2006.01)

(52) U.S. Cl. .................................... 327/158; 327/161

(58) Field of Classification Search ............... 327/147, 327/149, 152–156, 158, 161, 162
See application file for complete search history.

(56) References Cited

U.S. PATENT DOCUMENTS

| 5,506,878 A | | 4/1996 | Chiang |
| 5,550,499 A | | 8/1996 | Eitrheim |
| 5,638,016 A | | 6/1997 | Eitrheim |
| 5,777,500 A | | 7/1998 | Eitrheim |
| 5,781,055 A | * | 7/1998 | Bhagwan ................ 327/270 |
| 6,084,452 A | | 7/2000 | Drost et al. |
| 6,125,157 A | * | 9/2000 | Donnelly et al. .......... 375/371 |
| 6,211,714 B1 | * | 4/2001 | Jeong .......................... 327/293 |
| 6,316,979 B1 | * | 11/2001 | Keeth .......................... 327/258 |
| 6,380,778 B1 | | 4/2002 | Uehara et al. |
| 6,525,581 B1 | | 2/2003 | Choi |
| 6,539,072 B1 | * | 3/2003 | Donnelly et al. .......... 375/371 |
| 6,573,771 B1 | | 6/2003 | Lee et al. |
| 6,603,337 B1 | | 8/2003 | Cho |
| 6,628,154 B1 | * | 9/2003 | Fiscus ........................ 327/158 |
| 6,650,157 B1 | * | 11/2003 | Amick et al. ............... 327/158 |
| 6,765,421 B1 | * | 7/2004 | Brox et al. ................. 327/175 |
| 6,768,361 B1 | * | 7/2004 | Kwak .......................... 327/158 |
| 2001/0043103 A1 | | 11/2001 | Uehara et al. |
| 2002/0084818 A1 | | 7/2002 | Cho |

FOREIGN PATENT DOCUMENTS

| JP | 04-364603 | 12/1992 |
| JP | 05-315906 | 11/1993 |
| JP | 11-163691 | 6/1999 |
| JP | 11-272303 | 10/1999 |
| JP | 2001-326564 | 11/2001 |
| JP | 2002-290214 | 10/2002 |
| JP | 2003-110411 | 4/2003 |

* cited by examiner

Primary Examiner—Timothy P. Callahan
Assistant Examiner—Cassandra Cox

(57) ABSTRACT

An analog delay locked loop device includes a first block for receiving an internal clock signal and a reference clock signal to generate normal multi phase clock signal pairs and dummy multi phase clock signal pairs; and a second block for receiving the reference clock signal to generate a delay locked internal clock signal having a corrected duty cycle based on the normal multi phase clock signal pairs and the dummy multi phase clock signal pairs.

13 Claims, 11 Drawing Sheets

ANALOG DELAY LOCKED LOOP HAVING DUTY CYCLE CORRECTION CIRCUIT

FIELD OF INVENTION

The present invention relates to a semiconductor device; and, more particularly, to an analog delay locked loop (DLL) device having a duty cycle correction (DCC) circuit.

DESCRIPTION OF PRIOR ART

A synchronous semiconductor memory device which is operated synchronizing with an external clock signal receives the external clock signal and uses an internal clock signal generated from the received external clock signal. However, the internal clock signal is delayed in comparison with the external clock signal because of passing through internal circuits included in the synchronous semiconductor memory device. The delayed internal clock signal causes low performance of the synchronous semiconductor memory device.

Therefore, the synchronous semiconductor memory device should be provided with an apparatus for synchronizing the internal clock signal with the external clock signal.

Generally, a delay locked loop (DLL) device or a phase locked loop (PLL) device is provided for that purpose. The DLL device, however, has the advantage of low noise over the PLL device. Therefore, the DLL device is generally adopted for the synchronous semiconductor memory device.

In addition, the DLL device has three different types, i.e., an analog DLL device, a digital DLL device and a register controlled DLL device.

Meanwhile, it's very important to maintain a 50% duty cycle ratio of the internal clock signal in such as a synchronous semiconductor memory device that performs data access at both of a rising edge and a falling edge of the internal clock signal.

Therefore, a duty cycle correction (DCC) circuit is provided for the DLL device for correcting a duty cycle ratio.

Figure 1:
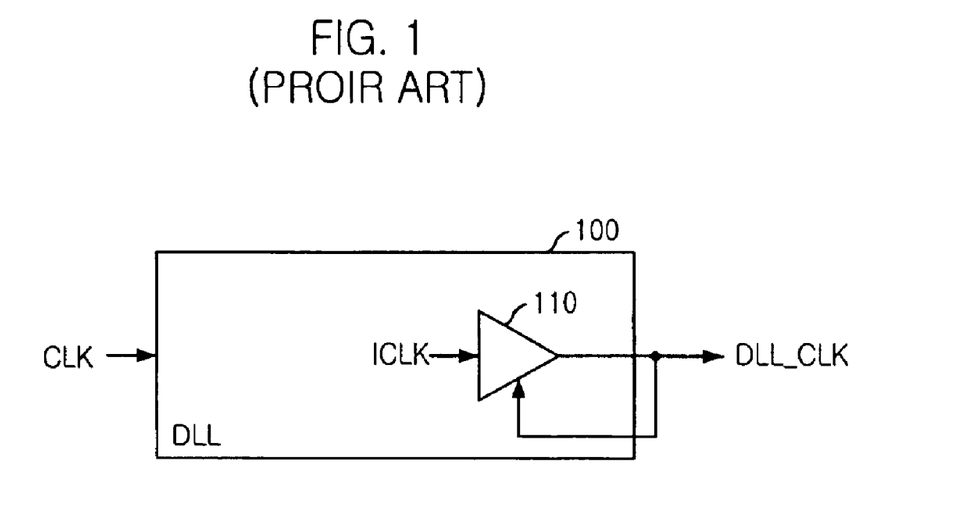
FIG. 1 is a block diagram showing a DCC circuit included in a conventional DLL device.

FIG. 1 is a block diagram showing a DCC circuit included in a conventional DLL device.

As shown, a DCC circuit 110 receives an internal clock signal ICLK to output a DLL clock signal DLL_CLK, wherein the internal clock signal ICLK is generated from an external clock signal CLK by synchronizing a rising edge of the internal clock signal ICLK with that of the external clock signal CLK. Also, the DCC circuit 110 receives the feed-backed DLL clock signal DLL_CLK to correct a duty cycle ratio of the DLL clock signal DLL_CLK.

Figure 2:
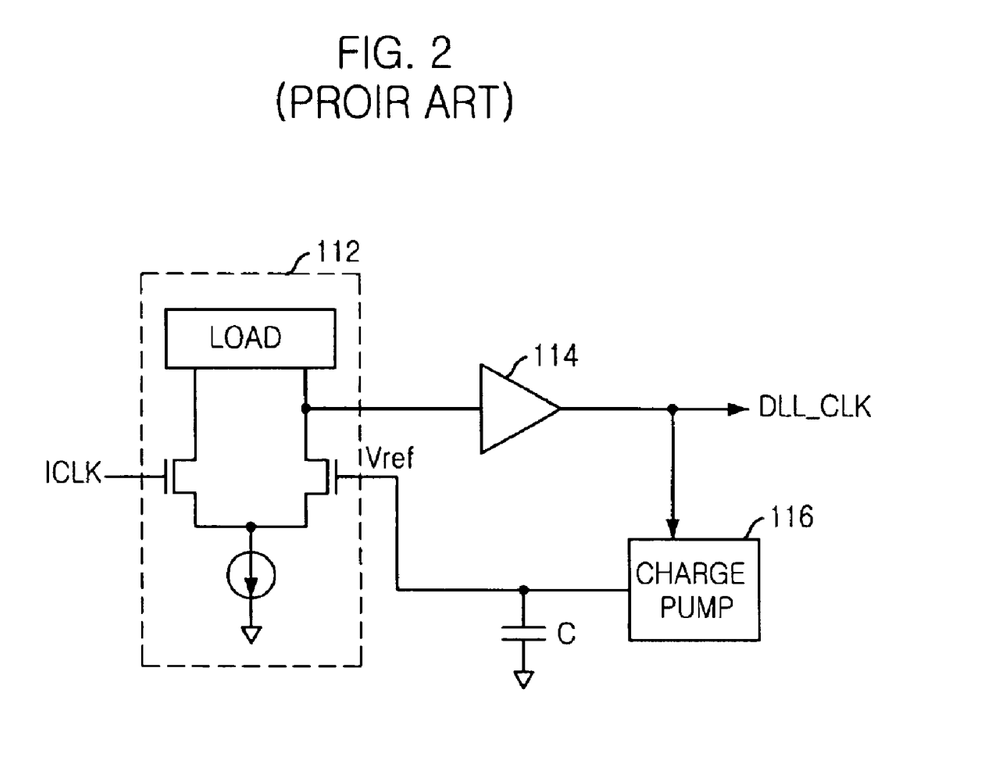
FIG. 2 is a circuit diagram showing the DCC circuit shown in FIG. 1.

FIG. 2 is a circuit diagram showing the DCC circuit 110 shown in FIG. 1.

As shown, the DCC circuit 110 includes a differential amplifier unit 112, a buffer 114, a charge pump 116 and a capacitor C.

The differential amplifier unit 112 receives the internal clock signal ICLK and a reference voltage Vref as input signals. The buffer 114 is for buffering an outputted signal from the differential amplifier unit 112 and for outputting the buffered signal as the DLL clock signal DLL_CLK. The charge pump 116 performs charge pumping operation receiving the DLL clock signal DLL_CLK. The capacitor C is connected to an output of the charge pump 116.

The DCC circuit 110 shown in FIG. 2 performs a duty cycle correction operation based on the fact that a current difference between a current flown at a logic 'HIGH' level period and a current flown at a logic 'LOW' level period becomes 0 in case of a clock signal having a 50% duty cycle ratio.

The charge pump 116 pumps a charge to the capacitor C in response to the DLL clock signal DLL_CLK. The pumped charge is stored in the capacitor C. Then, the stored charge in the capacitor C is feed-backed to the differential amplifier unit 112 as the form of the reference voltage Vref.

Thereafter, the differential amplifier unit 112 controls a common mode level of the buffer 114 to correct the duty cycle ratio depending on the reference voltage Vref.

However, in this duty cycle correction operation, the initial time for locking the DLL is increased in proportion to duty compensating quantity because of a feed-back method, wherein the feed-back method means that the duty cycle correction operation is performed by feed-backing the stored charge on the capacitor C to the differential amplifier unit 112 until the DLL is locked. Moreover, in the duty cycle correction operation, since the common mode level is limited, the DLL device can correct limited duty error.

SUMMARY OF INVENTION

It is, therefore, an object of the present invention to provide a delay locked loop (DLL) device which can correct a wide range of a duty error and reduce an initial time for locking the DLL.

In accordance with an aspect of the present invention, there is provided a first block for receiving an internal clock signal and a reference clock signal to generate normal multi phase clock signal pairs and dummy multi phase clock signal pairs; and a second block for receiving the reference clock signal to generate a delay locked internal clock signal having a corrected duty cycle based on the normal multi phase clock signal pairs and the dummy multi phase clock signal pairs.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an analog delay locked loop (DLL) device in accordance with the present invention will be described in detail referring to the accompanying drawings.

Figure 3:
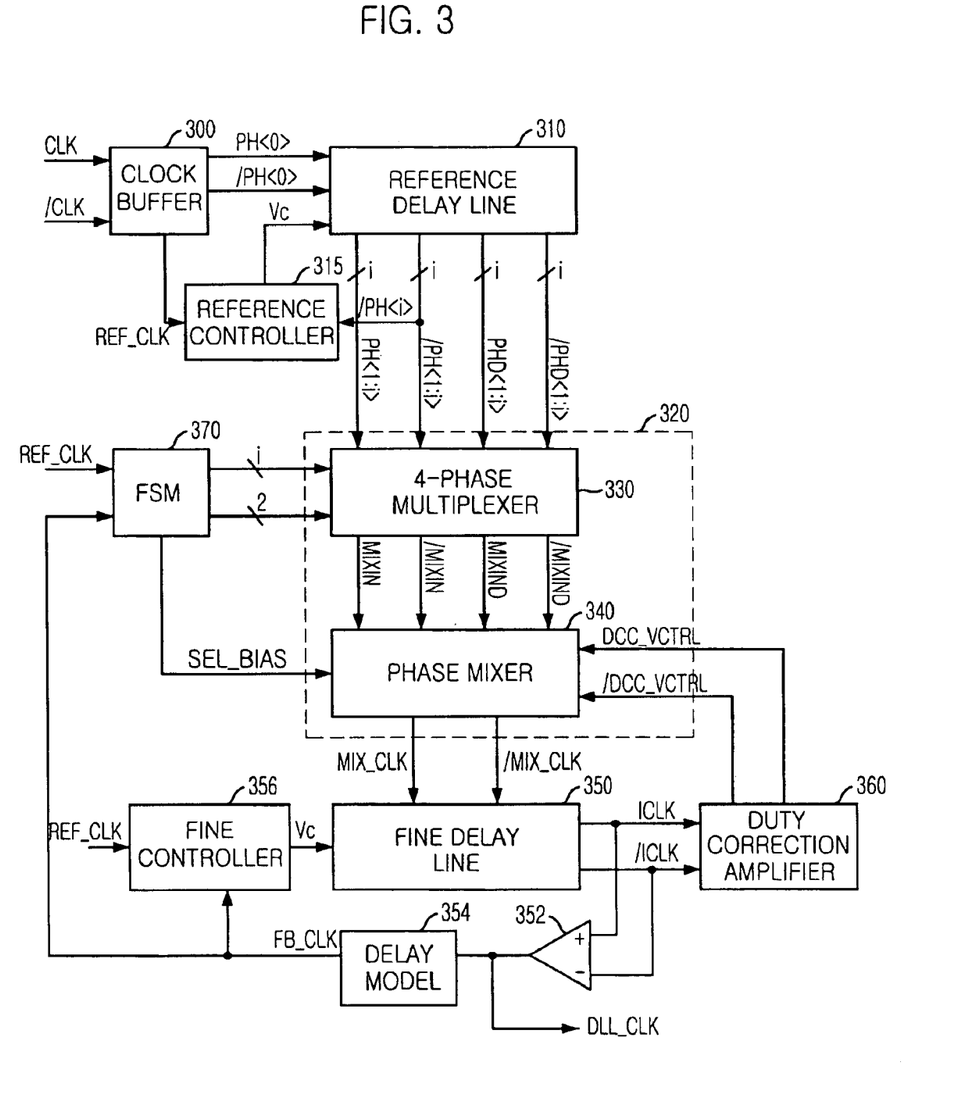
FIG. 3 is a block diagram showing an analog DLL device in accordance with an embodiment of the present invention.

FIG. 3 is a block diagram showing an analog DLL device in accordance with an embodiment of the present invention.

As shown, the analog DLL device includes a clock buffer 300, a reference delay line 310, a reference controller 315, a clock interface 320, a fine delay line 350, a differential amplifier 352, a duty correction amplifier 360, a delay model 354, a fine controller 356 and a finite state machine FSM 370.

The clock buffer 300 receives an external clock signal pair CLK and /CLK in order to output an internal clock signal pair PH<0> and /PH<0> and a reference clock signal. REF_CLK. The reference clock signal REF_CLK and the internal clock signal PH<0> are the same, i.e., thereby the reference clock signal REF_CLK can be substituted by the internal clock signal PH<0>.

The reference delay line 310 receives the internal clock signal pair PH<0> and /PH<0> to output normal multi phase clock signal pairs PH<1> and /PH<1>, PH<2> and /PH<2>, ..., PH<i> and /PH<i>; and dummy multi phase clock signal pairs PHD<1> and /PHD<1>, PHD<2> and /PHD<2>, ..., PHD<i> and /PHD<i>. The reference controller 315 controls the reference delay line 310 for the reference clock signal REF_CLK and the normal multi clock signal /PH<i> to have the same phase by comparing the phases of the REF_CLK with the /PH<i>.

Herein, the notation 'PH<1:i>' means PH<1>, PH<2>, ..., PH<i>. The i is a natural number, more exactly, a natural number larger than 1. The number of i is determined by a total number of differential delay cells included in delay lines of the reference delay line 310. For example, PH<1:2> means PH<1> and PH<2>. In addition, the word 'pair' is used for referring a signal and its inverted signal, e.g., 'a pair PH<1> and /PH<1>' means 'PH<1> and its inverted signal /PH<1>', 'pairs PH<1:2> and /PH<1:2>' means 'a pair PH<1> and /PH<1>, and a pair PH<2> and /PH<2>'. When only the 'PH<1>' is referred, the 'pair' is omitted, e.g., 'normal multi phase clock signals PH<1:i>'. The 'multi' is used when the number of referred signals is more than 1 or the number of referred signal pairs is more than 1, if not, the 'multi' is omitted. For example, 'normal multi phase signals PH<1:i>', 'normal phase signal PH<1>'.

The clock interface 320 is for performing a duty cycle correction by mixing phases of a selected pair of the normal multi phase clock signal pairs with phases of a selected pair of the dummy multi phase clock signal pairs. For example, by mixing phases of 'a pair PH<3> and /PH<3>' with phases of 'a pair PHD<3> and /PHD<3>', i.e., by mixing phase of the PH<3> with phase of the PHD<3> and by mixing phase of the /PH<3> with phase of the /PHD<3>.

The outputted mixed differential clock signal pair MIX_CLK and /MIX_CLK from the clock interface 320 is inputted to the fine delay line 350. The differential amplifier 352 is for generating a DLL clock signal DLL_CLK by amplifying outputs of the fine delay line 350. The delay model 354 is for modeling a delaying quantity and outputs a feed-backed clock signal FB_CLK.

The fine controller 356 controls the fine delay line 350 by comparing the feed-backed clock signal FB_CLK with the reference clock signal REF_CLK. The finite state machine FSM is for controlling the whole DLL receiving the reference clock signal REF_CLK and the feed-backed clock signal FB_CLK.

The duty correction amplifier 360 is for supporting the clock interface to correct duty cycle ratio receiving outputs from the fine delay line 350.

Meanwhile, the reference controller 315 includes a phase detector, a charge pump and a loop filter (not shown)—those are generally included in a DLL device—and controls the reference delay line 310 by using a voltage Vc charged in a capacitor in the loop filter. The fine controller 356 has almost same structure as that of the reference controller 315.

Figure 4:
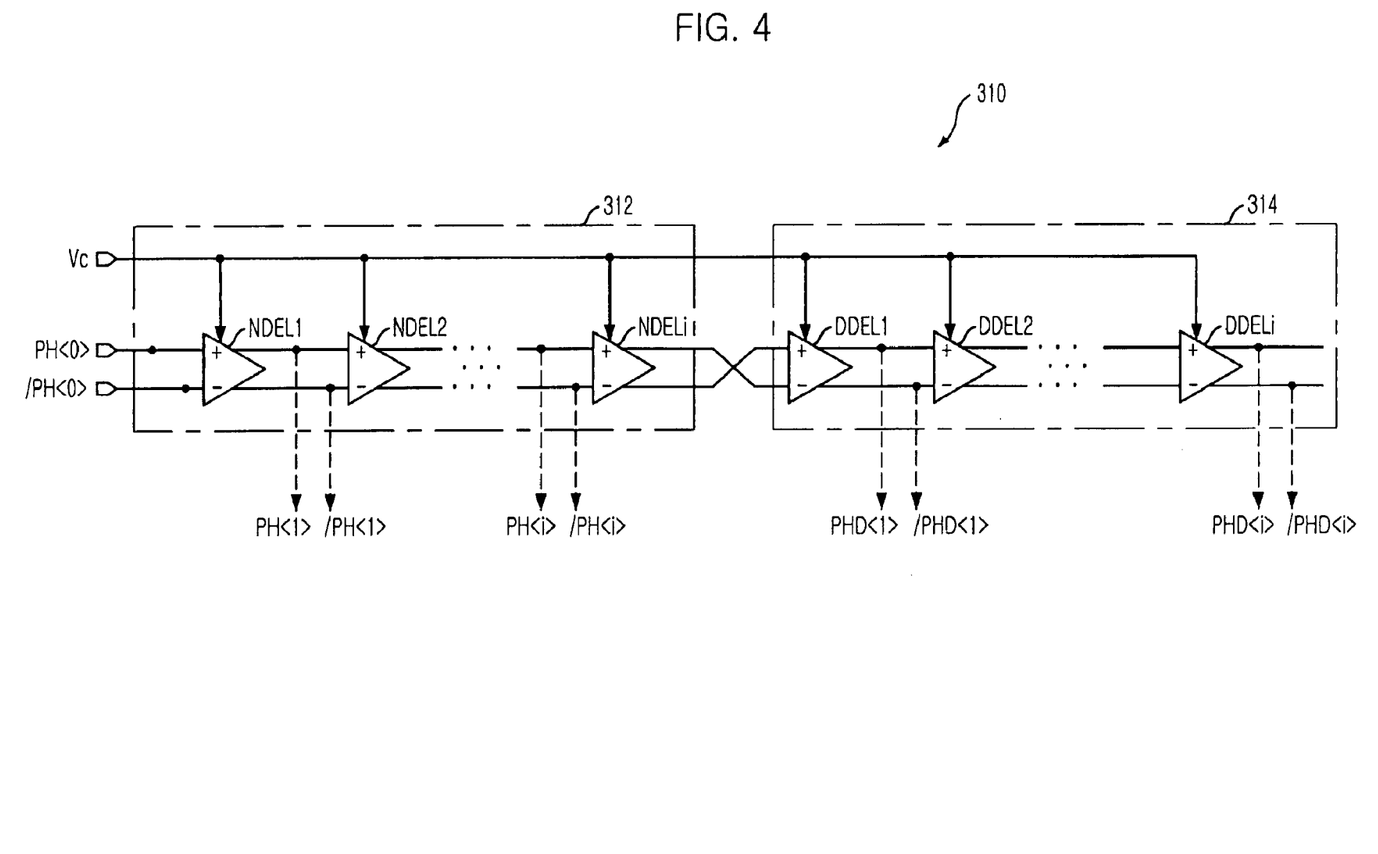
FIG. 4 is a circuit diagram showing a reference delay line shown in FIG. 3.

FIG. 4 is a circuit diagram showing the reference delay line 310.

As shown, the reference delay line 310 includes a normal delay line 312 and a dummy delay line 314.

The normal delay line 312 is provided with i differential delay cells—NDEL1, NDEL2, ..., NDELi—receiving the internal clock signal pair PH<0> and /PH<0>.

The dummy delay line 314 is provided with i differential delay cells—DDEL1, DDEL2, ..., DDELi—receiving outputted signal pair PH<i> and /PH<i> from the normal delay line 312.

Herein, the normal phase clock signal pair PH<k> and /PH<k> is outputted from the NDELk, wherein the 'k' is a natural number and 1<=k<=i.

Each of the differential delay cells included in the normal delay line 312 and the dummy delay line 314 is controlled by the voltage Vc charged on the capacitor in the loop filter, thereby the whole delaying quantity of the reference delay line 310 is controlled.

Meanwhile, the fine delay line 350 is embodied by using differential delay cells like the reference delay line 310.

Figure 5A:
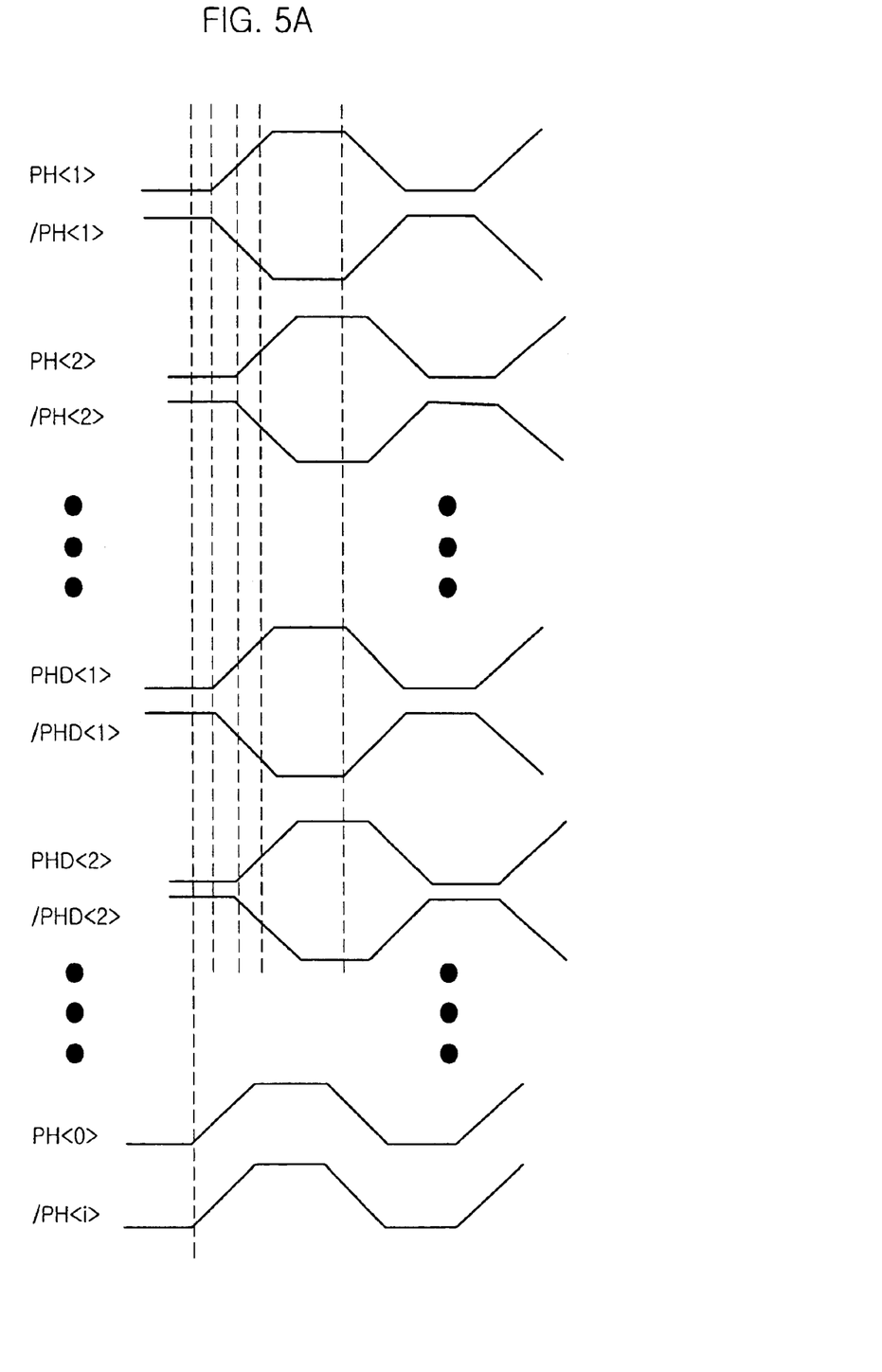
FIGS. 5A and 5B are timing diagrams depicting a normal multi phase clock signal pairs and a dummy multi phase clock signal pairs outputted from the reference delay line.

FIG. 5A is a timing diagram showing the normal multi phase clock signal pairs PH<1> and /PH<1>, PH<2> and /PH<2>, ..., PH<i> and /PH<i> and the dummy multi phase clock signal pairs PHD<1> and /PHD<1>, PHD<2> and /PHD<2>, ..., PHD<i> and /PHD<i> outputted from the reference delay line 310.

In this case, a duty cycle ratio of the external clock signal pair CLK and /CLK is 50%.

The internal clock signal pair PH<0> and /PH<0> passes through the i differential delay cells NDEL1~NDELi, and the NDELk of the differential delay cells outputs the normal multi phase clock signal pair PH<k> and /PH<k> delaying the internal clock signal pair PH<0> and /PH<0>, wherein k is a natural number and 1<=k<=i.

Thereafter, the outputted signal pair PH<i> and /PH<i> from the NDELi is cross inputted to the dummy delay line 314 and passes through the i differential delay cells DDEL1 to DDELi, and each of the differential delay cells outputs the normal multi phase clock signal pairs PHD<1:i> and /PHD<1:i> delaying the internal clock signal pair PH<i> and /PH<i>.

The phase detector included in the reference controller 315 compares a phase of the reference clock signal REF_CLK with a phase of the normal multi phase clock signal /PH<i>.

Therefore, if delay locked, the internal clock signal PH<0> is synchronized with the normal phase clock signal /PH<i>. And, there is a phase difference of 180° between the internal clock signal PH<0> with the normal phase clock signal PH<i>. There is also a phase difference of 180° between the normal phase clock signal PH<i> with the normal dummy phase clock signal PHD<i>. Therefore, the normal multi phase signals PH<1:i> and the dummy multi phase signals PHD<1:i> have a phase difference of from 0° to 360°.

Herein, since the duty cycle ratio of the external clock signal pair CLK and /CLK is 50%, a falling edge of the reference clock signal REF_CLK synchronizes with a falling edge of the multi phase clock signal /PH<i>.

Figure 5B:
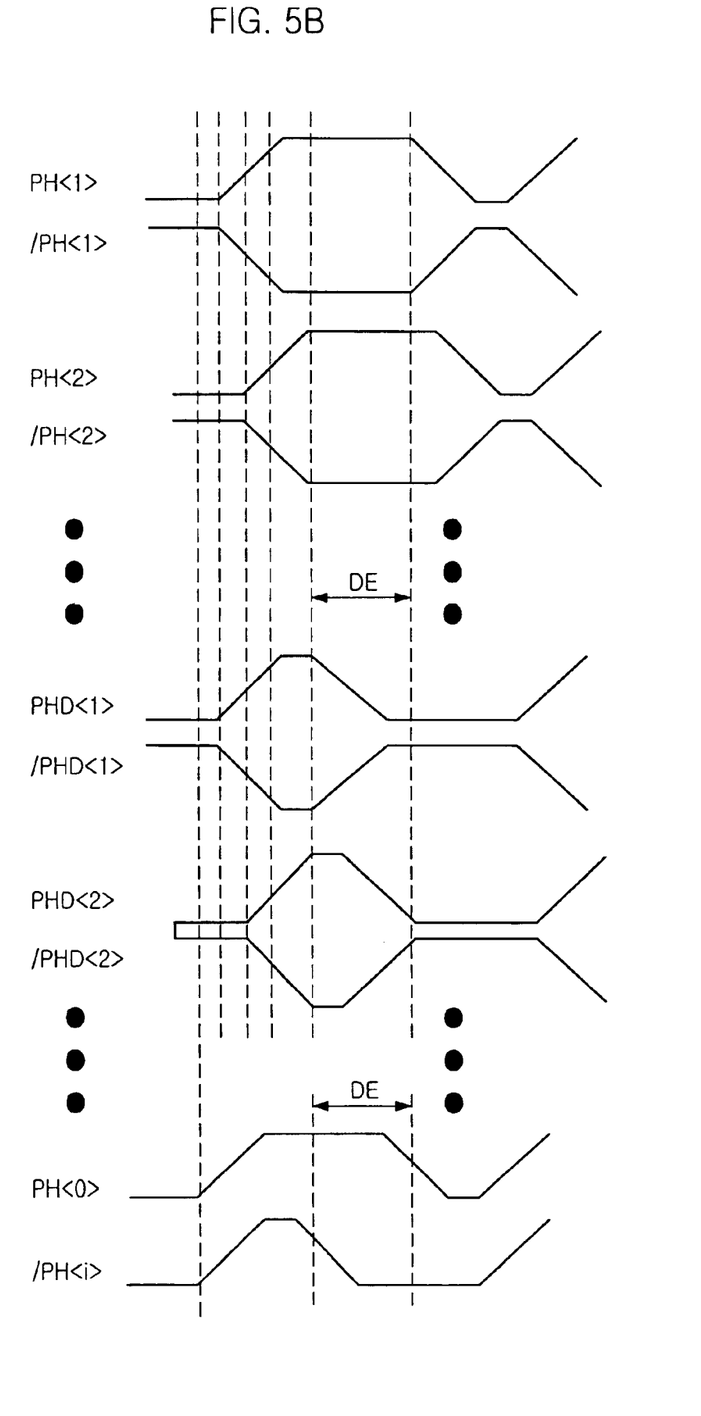

FIG. 5B is a timing diagram showing the normal multi phase clock signal pairs and the dummy multi phase clock signal pairs outputted from the reference delay line 310; herein, a duty cycle ratio of the external clock signal pair CLK and /CLK is not 50% and it is assumed that a logic 'HIGH' level period is longer than a logic 'LOW' level period within one clock cycle, i.e., the duty cycle ratio is more than 50%.

In this case, if delay locked, the reference clock signal REF_CLK is synchronized with the normal multi phase clock signal /PH<i>. However, a falling edge of the reference clock signal is not synchronized with a falling edge of the multi phase clock signal /PH<i> since the duty ratio of the external clock signal pair CLK and /CLK is not 50%. Therefore, there exists a phase difference of 'DE' between the falling edge of reference clock signal REF_CLK and the normal phase clock signal /PH<i>. This phase error, i.e., 'DE' is twice as the duty error of the external clock signal CLK or /CLK.

Figure 6:
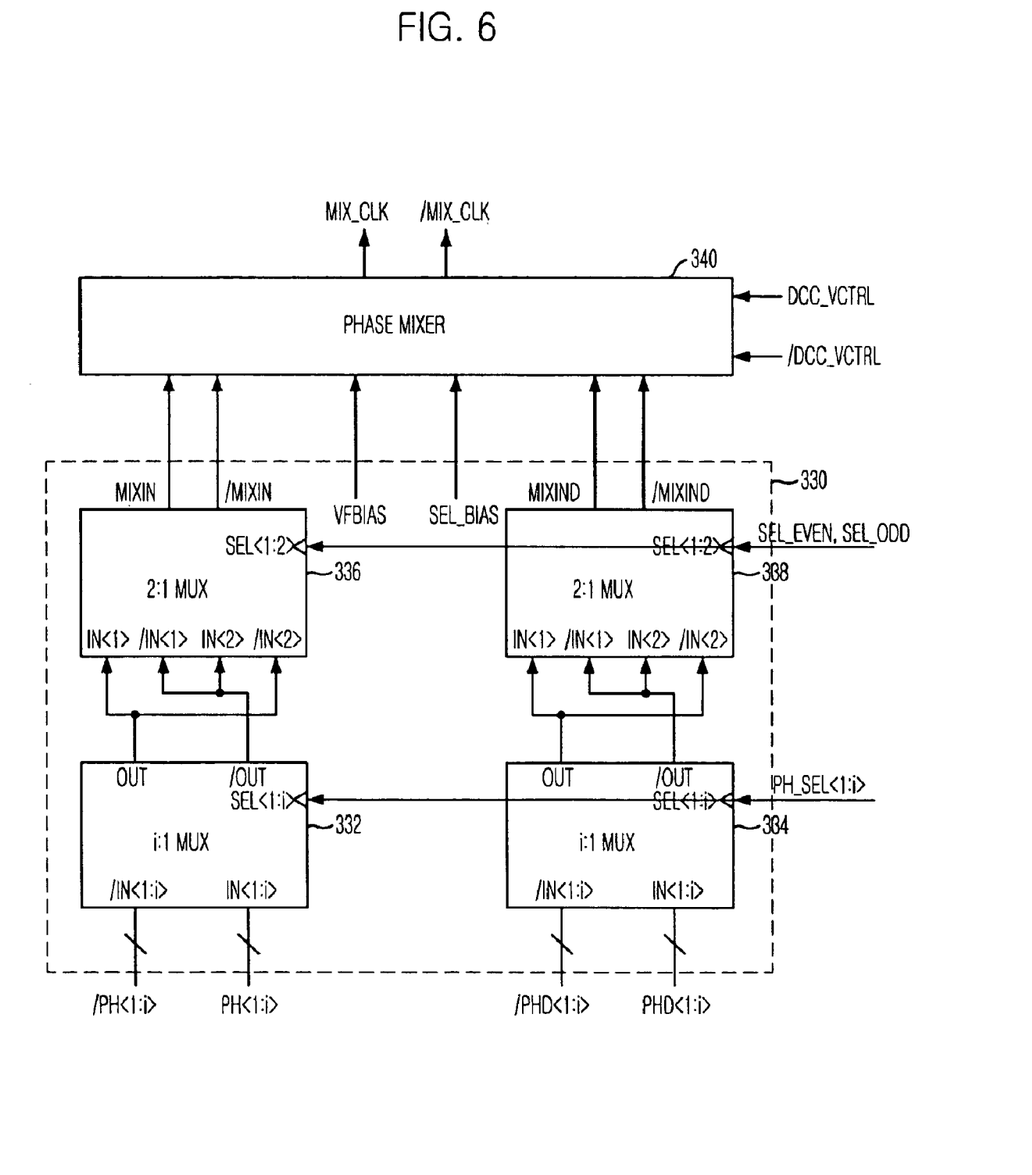
FIG. 6 is a block diagram showing a clock interface shown in FIG. 3.

FIG. 6 is a block diagram showing the clock interface 320.

As shown, the clock interface 320 includes a 4-phase multiplexer 330 and a phase mixer 340.

The 4-phase multiplexer 330 has a first i:1 multiplexer 332, a second i:1 multiplexer 334, a first 2:1 multiplexer 336 and a second 2:1 multiplexer 338.

A first main input terminal IN<1:i> and a first sub input terminal /IN<1:i> of the first i:1 multiplexer 332 receives the normal multi phase clock signal pairs PH<1:i> and /PH<1:i> respectively, then, the first i:1 multiplexer 332 selects one of the inputted signal pairs and outputs the selected signal pair. Herein, this operation is controlled by a phase selection signal PH_SEL<1:i> outputted by the finite state machine FSM 370.

A second main input terminal IN<1:i> and a second sub input terminal /IN<1:i> of the second i:1 multiplexer 334 receives the dummy multi phase clock signal pairs PHD<1:i> and /PHD<1:i> respectively, then, the i:1 multiplexer 334 selects one of the inputted signal pairs and outputs the selected signal pair. Herein, this operation is controlled by the phase selection signal PH_SEL<1:i> outputted by the finite state machine FSM 370.

A third and fourth main input terminals IN<1> and IN<2>; and a third and fourth sub input terminals /IN<1> and /IN<2> of the first 2:1 multiplexer 336 receive the outputted signals from the first i:1 multiplexer 332 and output those received signals selectively controlled by even and odd selection signals SEL_EVEN and SEL_ODD outputted from the finite state machine FSM 370.

A fifth and sixth main input terminals IN<1> and IN<2>; and a fifth and sixth sub input terminals /IN<1> and /IN<2> of the second 2:1 multiplexer 338 receive the outputted signals from the second i:1 multiplexer 334 and output those received signals selectively controlled by the even and odd selection signals SEL_EVEN and SEL_ODD outputted from the finite state machine FSM 370.

Therefore, the 4-phase multiplexer 334 is for selecting one of the normal multi phase clock signal pairs PH<1> and /PH<1>, PH<2> and /PH<2>, . . . , PH<i> and /PH<i> and one of the dummy multi phase clock signal pairs PHD<1> and /PHD<1>, PHD<2> and /PHD<2>, . . . , PHD<i> and /PHD<i> outputted from the normal delay line 312 and the dummy delay line 314 respectively; then, the selected signals become input signals, i.e., a normal differential clock signal pair MIXIN and /MIXIN, a dummy differential clock signal pair MIXIND and /MIXIND for the phase mixer 340.

Thereafter, the phase mixer 340 phase mixes the normal differential clock signal pair MIXIN and /MIXIN each other; and also phase mix the dummy differential clock signal pair MIXIND and /MIXIND each other, then, outputs a mixed signal pair, i.e., a mixed differential clock signal pair MIX_CLK and /MIX_CLK. Herein, a phase mixing is operated so that a phase of the MIX_CLK is in the middle of phases of the MIXIN and the /MIXIN, and a phase of the /MIX_CLK is in the middle of the phases of the MIXIND and the /MIXIND. The phase mixer 340 is controlled by a first duty control voltage DCC_VCTRL and a second duty control voltage /DCC_VCTRL outputted by the duty correction amplifier 360.

Figure 7:
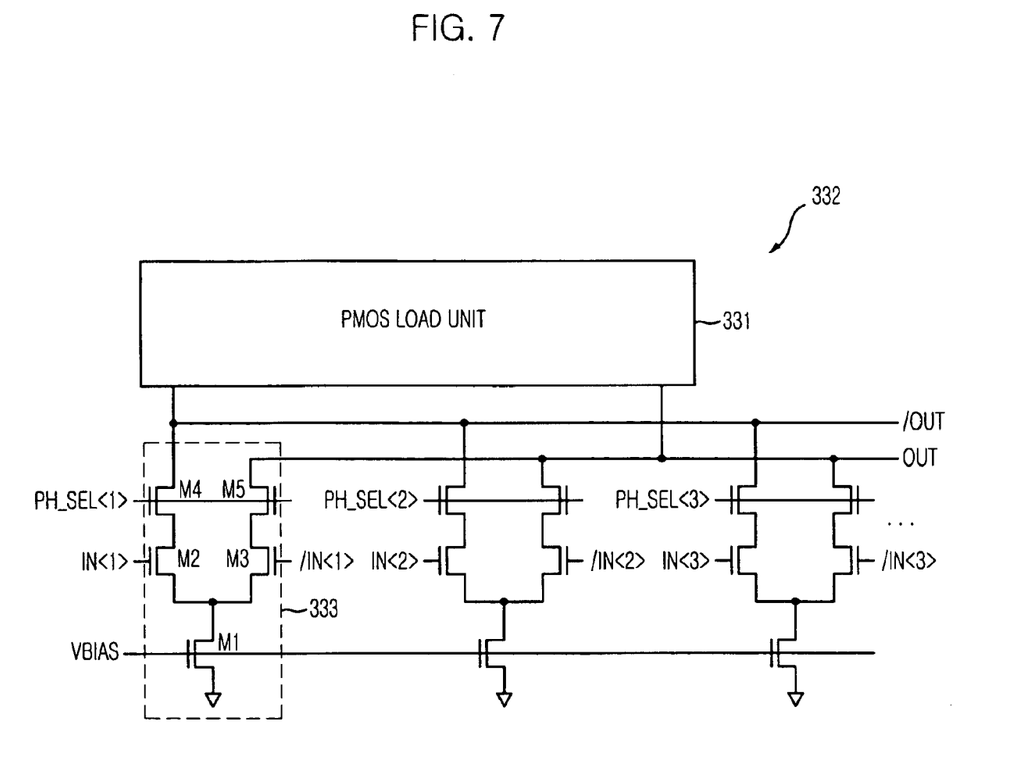
FIG. 7 is a circuit diagram showing an embodiment of a first i:1 multiplexer shown in FIG. 6.

FIG. 7 is a circuit diagram showing an embodiment for the first i:1 multiplexer 332.

As shown, the first i:1 multiplexer 332 includes a first PMOS load unit 331 and i number of unit selectors, wherein, each structure of the unit selectors is the same and the structure is described below referring to the first unit selector 333.

The first PMOS load unit 331 is connected to outputs of the i number of unit selectors.

The first unit selector 333 is provided with a first NMOS transistor M1, a second NMOS transistor M2, a third NMOS transistor M3, a fourth NMOS transistor M4 and a fifth NMOS transistor M5.

A gate of the first NMOS transistor M1 is connected to a bias voltage VBIAS, and the first NMOS transistor M1 operates as a main current source. Gates of the second and third transistors M2 and M3 are connected to the main input terminal IN<1> and the sub input terminal /IN<1> respectively. Sources of the M2 and the M3 are connected to a drain of the M1. The fourth and fifth NOMS transistors M4 and M5 are connected between output terminals and the M2 and M3. Gates of the M4 and M5 are connected to the phase selection signal PH_SEL<1>. Herein, the main input terminal IN<1> and the sub input terminal /IN<1> receives the normal multi phase clock signals PH<1> and /PH<1> respectively.

Meanwhile, structures of the other unit selectors are the same as the structure of the first unit selector 333 described above. The second i:1 multiplexer 334 can be embodied like the first second i:1 multiplexer 332 described above.

Figure 8:
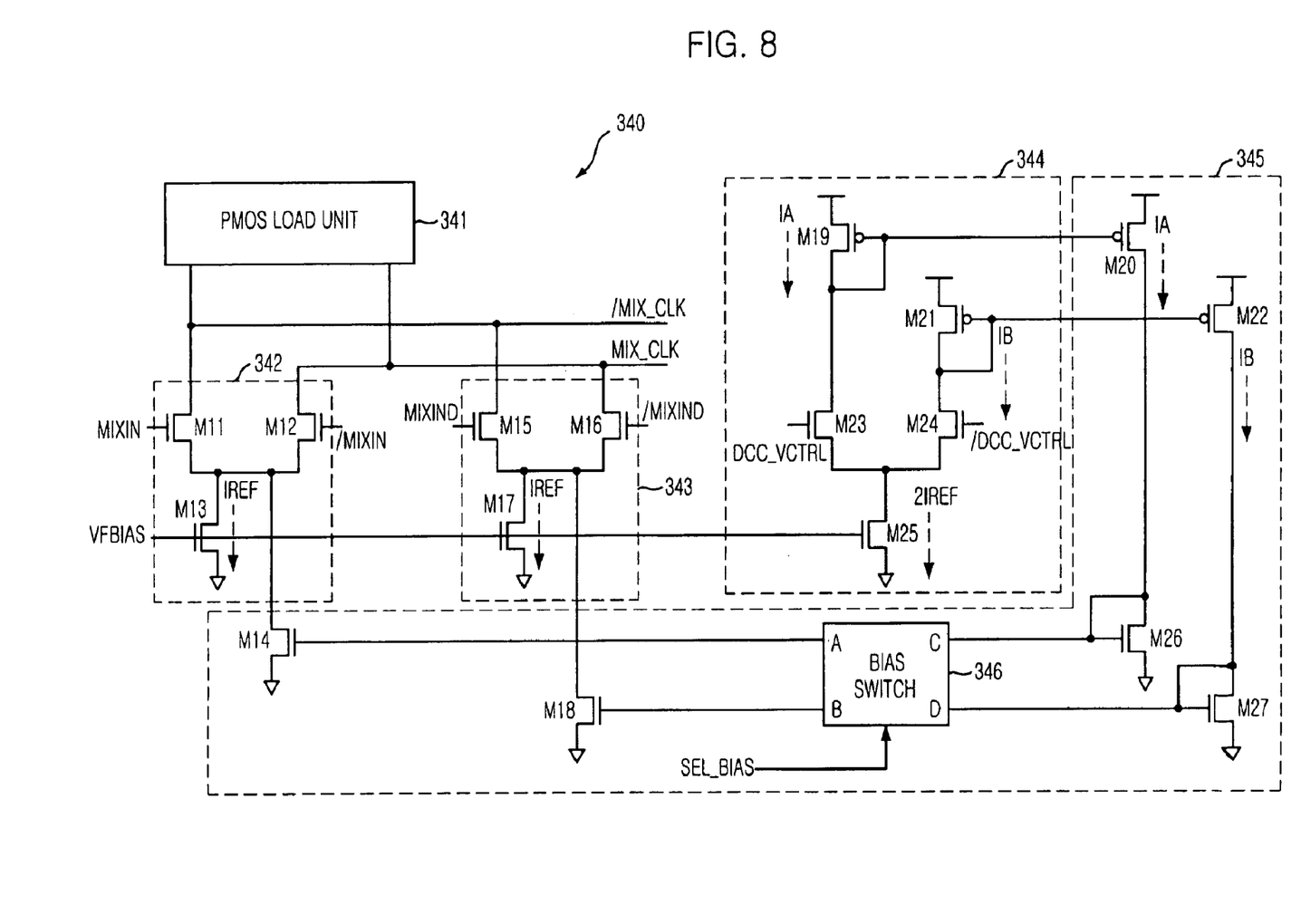
FIG. 8 is a circuit diagram showing an embodiment of a phase mixer shown in FIG. 6.

FIG. 8 is a circuit diagram showing an embodiment for the phase mixer 340 shown in FIG. 6.

As shown, the phase mixer 340 includes a first source-coupled pair 342, a second source-coupled pair 343, a second PMOS load unit 341, a differential amplifying unit 344 and a bias controller 345.

The first source-coupled pair 342 is biased by a fixed bias voltage VFBIAS and receives the normal differential clock signal pair MIXIN and /MIXIN. The second source-coupled pair 343 is biased by the fixed bias voltage VFBIAS and receives the normal differential clock signal pair MIXIN and /MIXIN. The second PMOS load unit 341 is connected to the first and second source-coupled pairs 342 and 343. The second PMOS load unit 341, the first and second source-coupled pairs 342 and 343 form a differential amplifier.

The differential amplifying unit 344 is biased by the fixed bias voltage VFBIAS and receives the first and second duty control voltages DCC_VCTRL and /DCC_VCTRL. The bias controller 345 mirrors a first differential current IA and a second differential current IB of the differential amplifying unit 344 in order to control a sink current of the first and second source-coupled pairs 342 and 343 depending on the duty cycle ratio of the external clock signal pair CLK and /CLK.

The first source-coupled pair 342 is provided with an eleventh NMOS transistor M11, a twelfth NMOS transistor M12 and a thirteenth NMOS transistor M13.

A gate of the thirteenth NMOS transistor M13 is connected to the fixed bias voltage VFBIAS, and the M13 operates as a current source. The eleventh and twelfth NMOS transistors M11 and M12 receive the normal differential clock signal pair MIXIN and /MIXIN respectively.

A gate of the seventeenth NMOS transistor M17 is connected to the fixed bias voltage VFBIAS, and the M17 operates as a current source. The fifteenth and sixteenth NMOS transistors M15 and M16 receive the dummy differential clock signal pair MIXIND and /MIXIND respectively.

The differential amplifying unit 344 is provided with a twenty third NMOS transistor M23, a twenty fourth NMOS transistor M24, a twenty fifth NMOS transistor M25, and first diode coupled PMOS transistors, i.e., a nineteenth PMOS transistor M19 and a twenty first PMOS transistor M21.

A gate of the twenty fifth NMOS transistor M25 is connected to the fixed bias voltage VFBIAS, and the M25 operates as a current source. The twenty third and twenty fourth NMOS transistors M23 and M24 are connected to a source of the twenty fifth NMOS transistor M25, and receive the first and second duty control voltages DCC_VCTRL and /DCC_VCTRL respectively. The diode coupled PMOS transistors are connected to the twenty third and twenty fourth NMOS transistors M23 and M24 respectively.

The bias controller 345 is provided with a twentieth PMOS transistor M20, a twenty second PMOS transistor M22, a bias switch 346, a fourteenth NMOS transistor M14, an eighteenth NMOS transistor M18 and second diode coupled NMOS transistors, i.e., a twenty sixth NMOS transistor M26 and a twenty seventh NMOS transistor M27.

The twentieth PMOS transistor M20 and the twenty second PMOS transistor M22 is for mirroring a first current IA and a second current IB flown in the differential amplifier unit 344.

The twenty sixth NMOS transistor M26 and the twenty seventh NMOS transistor M27 are operated as a current sink for a first mirrored current IA and a second mirrored current IB flown in the bias controller 345.

The fourteenth NMOS transistor M14 is parallel connected to a source of the thirteenth NMOS transistor M13. The eighteenth NMOS transistor M18 is parallel connected to a source of the seventeenth NMOS transistor M17. Herein, each of the M14 and the M17 operates as a current source. The bias switch 346 has four terminals, i.e., a first terminal A, a second terminal B, a third terminal C and a fourth terminal D. The first, second, third and fourth terminals A, B, C and D are connected to the gate of the fourteenth NMOS transistor M14, the gate of the eighteenth NMOS transistor M18, the gate of the twenty sixth NMOS transistor M26 and the gate of the twenty seventh NMOS transistor M27 respectively.

Figure 9:
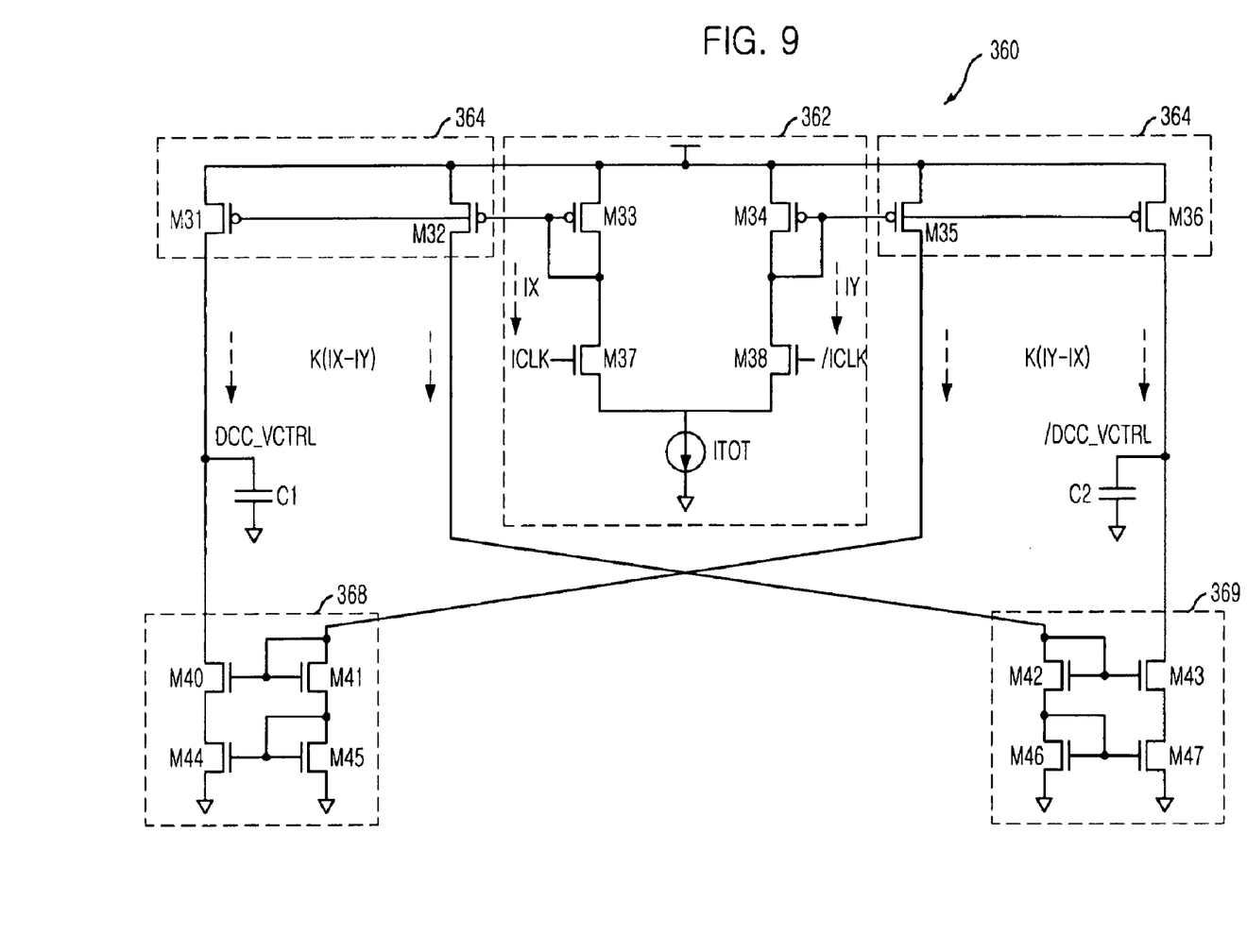
FIG. 9 is a circuit diagram showing a duty correction amplifier shown in FIG. 3.

FIG. 9 is a circuit diagram showing the duty correction amplifier 360.

As shown, the duty correction amplifier 360 includes a second differential amplifying unit 360, a first current mirroring unit 364, a second current mirroring unit 365, a first cascade load 368, a second cascade load 369, a first capacitor C1 and a second capacitor C2.

The differential clock signal pair ICLK and /ICLK outputted from the fine delay line 350 is inputted to the second differential amplifying unit 362 are. The first current mirroring unit 364 is for mirroring a current which flows on a sub output terminal of the second differential amplifying unit 362. The second current mirroring unit 365 is for mirroring a current which flows on a main output terminal of the second differential amplifying unit 362. Each of the first and second cascade loads 368 and 369 is connected to each of the first and second current mirroring units 364 and 365. The first and second capacitors C1 and C2 charge outputted current from the first and second mirroring units 364 and 365 respectively for generating the first and second duty control voltages DCC_VCTRL and /DCC_VCTRL.

The second differential amplifying unit 362 is provided with a current source, a thirty seventh NMOS transistor M37, a thirty eighth NMOS transistor M38 and third diode coupled PMOS transistors, i.e., a thirty third PMOS transistor M33 and a thirty fourth PMOS transistor M34.

The current source generates a total current ITOT to be traded off with capacitances of the first and second capacitors C1 and C2.

The thirty seventh and thirty eighth NMOS transistors M37 and M38 are connected between the third diode coupled PMOS transistors and the current source, and receive the internal clock signal pair ICLK and /ICLK respectively from the fine delay line 350. The thirty third PMOS transistor M33 is connected between a supplying voltage VDD and the thirty seventh NMOS transistor M37, the thirty fourth PMOS transistor M34 is connected between the supplying voltage VDD and the thirty eighth NMOS transistor M38. Herein, the thirty third PMOS transistor M33 and the thirty fourth PMOS transistor M34 operate as a load.

The first current mirroring unit 364 is provided with a thirty first PMOS transistor M31 and a thirty second PMOS transistor M32. The thirty first PMOS transistor M31 is connected between the supplying voltage VDD and the first cascade load 368, and the gate of the thirty first PMOS transistor M31 receives a sub output signal from the second differential amplifying unit 360. The thirty second PMOS transistor M32 is connected between the supplying voltage VDD and the second cascade load 369, and the gate of the M32 receives the sub output signal from the second differential amplifying unit 360.

The second current mirroring unit 365 is provided with a thirty fifth PMOS transistor M35 and a thirty sixth PMOS transistor M36. The thirty fifth PMOS transistor M35 is connected between the supplying voltage VDD and the first cascade load 368, and the gate of the M35 receives a main output signal from the second differential amplifying unit 360. The thirty sixth PMOS transistor M36 is connected between the supplying voltage VDD and the second cascade load 369, and the gate of the M36 receives the main output signal from the second differential amplifying unit 360.

The first capacitor C1 is connected between a first point of contact and a ground voltage VSS, wherein the first point of contact is a contacting point between the thirty first PMOS transistor M31 and the first cascade load 368.

The second capacitor C2 is connected between a second point of contact and the ground voltage VSS, wherein the second point of contact is a contacting point between the thirty sixth PMOS transistor M36 and the second cascade load 368.

Herein, each of the first and second capacitors C1 and C2 has the same capacitance.

The preferred embodiment shown in FIG. 3 in accordance with the present invention is described below referring to FIGS. 3–9.

The clock buffer 300 generates the internal clock signal pair PH<0> and /PH<0> and the reference clock signal REF_CLK by buffering the external clock signal pair CLK and /CLK. The reference delay line 310 receives the internal clock signal pair PH<0> and /PH<0> to output the normal multi phase clock signal pairs PH<1> and /PH<1>, PH<2> and /PH<2>, . . . , PH<i> and /PH<i>; and the dummy multi phase clock signal pairs PHD<1> and /PHD<1>, PHD<2> and /PHD<2>, . . . , PHD<i> and /PHD<i>.

Thereafter, the phase detector included in the reference controller 315 compares the phase of the reference clock signal REF_CLK with the phase of the normal phase clock signal /PH<i>, then, depending on the comparing result, the control voltage Vc is generated by the charge pump included in the reference controller 315. The control voltage Vc controls delaying quantity of each of the delay cells included in the normal delay line 312 and the dummy delay line 314. This operation is performed continuously until delay locked, i.e., until the reference clock signal REF_CLK is synchronized with the normal phase clock signal /PH<i>.

Thereafter, the finite state machine FSM 370 controls the clock interface 320 to transfer the normal multi phase clock signal pairs PH<1> and /PH<1>, PH<2> and /PH<2>, . . . , PH<i> and /PH<i> to the fine delay line 350 sequentially; at the same time, the FSM 370 controls the clock interface 320 to transfer the dummy multi phase clock signal pairs PHD<1> and /PHD<1>, PHD<2> and /PHD<2>, . . . , PHD<i> and /PHD<i> to the fine delay line 350 sequentially.

Then, the reference controller 315 compares the phase of the reference clock signal REF_CLK with that of the normal phase clock signal /PH<i>. Depending on the comparing result, the reference controller 315 adjusts the voltage Vc to control a delay quantity of the i differential delay cells.

The operation described above is performed continuously until the delay quantity of the i differential delay cells is locked, i.e., until the reference clock signal REF_CLK is synchronized with the normal phase clock signal /PH<i>.

Thereafter, if the delay quantity is locked, the finite state machine FSM 370 controls the clock interface 320 to transfer the normal multi phase clock signal pairs PH<1> and /PH<1>, PH<2> and /PH<2>, . . . , PH<i> and /PH<i> to the fine delay line 350 sequentially; at the same time, the FSM 370 controls the clock interface 320 to transfer the dummy multi phase clock signal pairs PHD<1> and /PHD<1>, PHD<2> and /PHD<2>, . . . , PHD<i> and /PHD<i> to the fine delay line 350 sequentially.

Then, the transferred normal multi phase clock signal pairs and dummy multi phase clock signal pairs are passed through the delay model 354 and inputted to the finite state machine FSM 370.

The finite state machine FSM 370 determines which of the clock pairs is the most synchronized with the reference clock signal REF_CLK. Then, the finite state machine FSM 370 controls the clock interface 320 to select and output the determined clock pairs.

Referring to FIG. 8, since the duty correction amplifier 360 is not operated at initial state, the fourteenth and eighteenth NMOS transistors M14 and M18 connected to the first and second source-coupled pairs 342 and 343 respectively are disabled. Therefore, the first and second source-coupled pairs 342 and 343 generate the mixed clock signal pair MIX_CLK and /MIX_CLK having almost 50% duty cycle ratio by mixing the normal differential clock signal pair MIXIN and /MIXIN each other and by mixing the dummy differential clock signal pair MIXIND and /MIXIND each other. Then, the mixed clock signal pair MIX_CLK and /MIX_CLK are outputted as the differential clock signal pair ICLK and /ICLK.

However, in case that a duty cycle error of the external clock signal pair CLK and /CLK is increased, since a gap between the normal differential clock signal pair MIXIN and /MIXIN is narrowed and a gap between the dummy differential clock signal pair MIX_CLK and /MIX_CLK is also narrowed, there still exits a small duty error.

Therefore, the analog DLL is provided with the duty correction amplifier 360. That is, the first and second duty control voltages DCC_VCTRL and /DCC_VCTRL outputted from the duty correction amplifier 360 control a bias voltage in the first and second source-coupled pair 342 and 343, to thereby erase a small duty cycle error.

Referring to FIG. 9, if the differential clock signal pair ICLK and /ICLK is inputted to the second differential amplifying unit 362, there flows a third current IX corresponded to a logic 'HIGH' level period of the differential clock signal ICLK, there also flows a fourth current IY corresponded to a logic 'LOW' level period of the differential clock signal /ICLK. The third current IX is mirrored by the first current mirroring unit 364 to charge a current valued k(IX–IY) to the first capacitor C1. The fourth current IY is mirrored by the second mirroring unit 365 to charge a current valued k(IY–IX) to the second capacitor C2. Herein, the k is a constant value corresponding to a gain of the second differential amplifying unit 362.

If the differential clock signal pair ICLK and /ICLK has a 50% duty cycle ratio, the same current is charged in the first and second capacitor C1 and C2, and thereby each of the first and second duty control voltages DCC_VCTRL and /DCC_VCTRL has the same voltage value. However, if the differential clock signal pair ICLK and /ICLK has a small duty cycle error, each of the first and second duty control voltages DCC_VCTRL and /DCC_VCTRL has a different voltage value.

Referring to FIG. 8, the first and second duty control voltages DCC_VCTRL and /DCC_VCTRL determine current values of the first and second differential currents IA and IB. The first and second differential currents IA and IB are mirrored into the bias controller 345 as the first mirrored current IA and the second mirrored current IB in the bias controller 345. The first and second mirrored currents IA and IB determine voltage values of the third bias terminal C and the fourth bias terminal D of the bias switch 346. The bias switch 346 selectively connects the third and fourth bias terminals C and D to the first and the second bias terminals A and B depending on the bias selection signal.

The bias selection signal SEL_BIAS is determined by the duty cycle ratio of the external clock signal pair CLK and /CLK. Depending on the bias selection signal SEL_BIAS, the first and second bias terminals A and B are differently connected to the third and fourth bias terminals C and D, thereby in order to controls a bias of the fourteenth and eighteenth NMOS transistor M14 and M18 connected to the first and second source-coupled pairs 342 and 343 respectively.

Figure 10A:
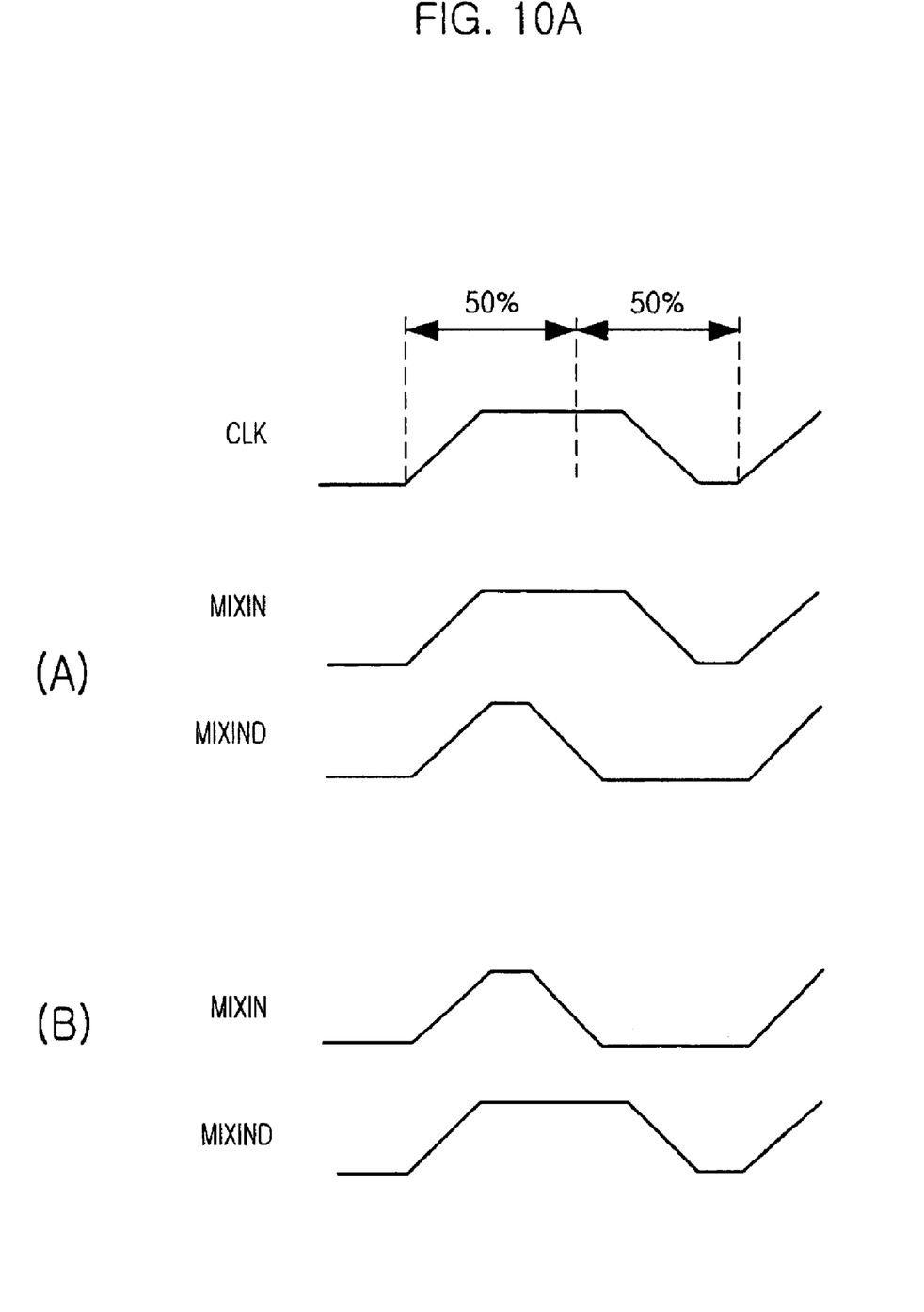
FIGS. 10A and 10B show an external clock signal having different duty cycle ratio.
Figure 10B:
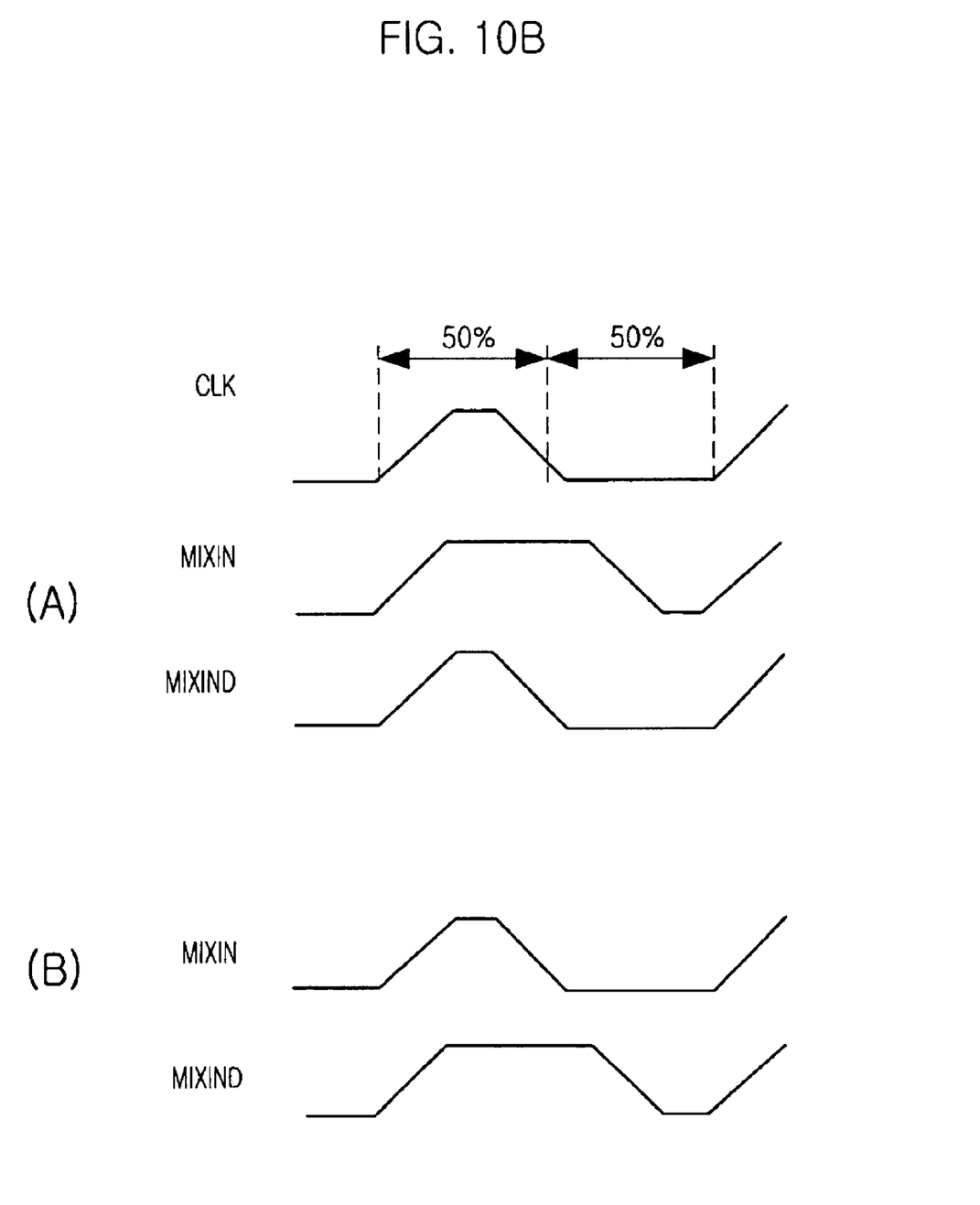

FIGS. 10A and 10B show the external clock signal CLK having different duty cycle ratio.

An operation of the bias switch 346 is described below referring FIGS. 10A and 10B.

The duty cycle ratio of the external clock signal CLK shown in FIG. 10A is bigger than 50%.

In this case, as shown in (A) of FIG. 10A, if a falling edge of the normal differential clock signal MIXIN lags behind that of the dummy differential clock signal MIXIND, the bias switch 346 connects the first bias terminal A to the third bias terminal C and also connects the second bias terminal B to the fourth bias terminal D.

On the other hand, as shown in (B) of FIG. 10A, if the falling edge of the normal differential clock signal MIXIN leads that of the dummy differential clock signal MIXIND, the bias switch 346 connects the first bias terminal A to the fourth bias terminal D and also connects the second bias terminal B to the third bias terminal C.

The duty cycle ratio of the external clock signal CLK shown in FIG. 10B is smaller than 50%.

In this case, if the falling edge of the normal differential clock signal MIXIN lags behind that of the dummy differential clock signal MIXIND as shown in (A) of FIG. 10B, the bias switch 346 connects the first bias terminal A to the fourth bias terminal D and also connects the second bias terminal B to the third bias terminal C.

On the other hand, if the falling edge of the normal differential clock signal MIXIN leads that of the dummy differential clock signal MIXIND as shown in (B) of FIG. 10B, the bias switch 346 connects the first bias terminal A to the third bias terminal C and also connects the second bias terminal B to the fourth bias terminal D.

While the present invention has been described with respect to the particular embodiments, it will be apparent to those skilled in the art that various changes and modifications may be made without departing from the spirit and scope of the invention as defined in the following claims.

What is claimed is:

1. An analog delay locked loop device comprising:
    a first block for receiving an internal clock signal and a reference clock signal to generate normal multi phase clock signal pairs and dummy multi phase clock signal pairs; and
    a second block for receiving the reference clock signal to generate a delay locked internal clock signal having a corrected duty cycle based on the normal multi phase clock signal pairs and the dummy multi phase clock signal pairs,
    wherein the first block includes:
    a reference delay line which receives the internal clock signal to output the normal multi phase clock signal pairs and the dummy multi phase clock signal pairs; and
    a reference control means which forms a reference loop with the reference delay line and controls the reference delay line for the reference clock signal and one signal of last clock signal pair of the normal multi clock signal pairs to have an opposite phase.

2. The analog delay locked loop device as recited in claim 1, wherein the second block includes:
    a clock interface which selects one of the normal multi phase clock signal pairs and one of the dummy multi phase clock signal pairs from the reference delay line to perform a duty cycle correction by mixing phases of each signal of the selected normal multi phase clock signal pair and by mixing phases of each signal of the selected dummy multi phase clock signal pair;
    a fine delay line which receives outputted signals from the clock interface to output the delay locked internal clock signal;
    a delay model for modeling a delaying quantity for the delay locked internal clock signal outputted from the fine delay line;
    a fine delaying means for controlling a delaying quantity of the fine delay line by comparing a feed-backed clock signal from the delay model with the reference clock signal;
    a control means which receives the reference clock signal and the feed-backed clock signal to control the clock interface; and
    a duty correction amplifying means for supporting the clock interface to correct duty cycle ratio receiving outputted signal from the fine delay line.

3. The analog delay locked loop device as recited in claim 1, wherein the reference delay line includes:
    a normal delay line which receives the internal clock signal and has a plurality of serial connected differential delay cells for generating the normal multi phase clock signal pairs; and
    a dummy delay line which receives the last clock signal pair from the normal delay line and has a plurality number of serial connected differential delay cells.

4. The analog delay locked loop device as recited in claim 2, wherein the clock interface includes:
    a phase multiplexing means controlled by the control means to select one of the normal phase clock signal pairs and one of the dummy phase clock signal pairs from the reference delay line; and
    a phase mixing means for mixing phases of the selected normal phase clock signal pair and for mixing phases of the selected dummy phase clock signal pair.

5. The analog delay locked loop device as recited in claim 4, wherein the phase multiplexing means includes:
    a first multiplexer for outputting one of the normal multi phase clock signal pairs in response to a phase selection signal outputted from the control means;
    a second multiplexer for outputting one of the dummy multi phase clock signal pairs in response to the phase selection signal;
    a third multiplexer for selectively outputting the one of the normal multi phase clock signal pairs from the first multiplexer in response to an even-odd selection signal outputted from the control means; and
    a fourth multiplexer for selectively outputting the one of the dummy multi phase clock signal pairs from the second multiplexer in response to the even-odd selection signal.

6. The analog delay locked loop device as recited in claim 4, wherein the phase mixing means includes:
    a first source-coupled pair which receives a normal differential clock signal pair and has a first fixed current source;
    a second source-coupled pair which receives a dummy differential clock signal pair and has a second fixed current source;
    a first load unit connected to the first source-coupled pair and the second source-coupled pair for forming a differential amplifier;
    a first differential amplifying unit which receives a duty control voltage outputted from the duty correction amplifying means; and
    a bias control unit for controlling a sink current of the first source-coupled pair and the second source-coupled pair by mirroring a differential current outputted from the first differential amplifying unit.

7. The analog delay locked loop device as recited in claim 6, wherein the bias control unit includes:

a first MOS transistor and a second MOS transistor for mirroring the differential current outputted from the first differential amplifying unit;

a third MOS transistor and a fourth MOS transistor which are operated as a current sink for the mirrored differential current;

a fifth MOS transistor and a sixth MOS transistor connected parallel to the first fixed current source and to the second fixed current source respectively to control a bias of the first source-coupled pair and the second source-coupled pair; and a switch for switching between gates of the third and fourth MOS transistors and gates of the fifth and sixth MOS transistors in response to the bias selection signal outputted from the control means.

8. The analog delay locked loop device as recited in claim 7, wherein the duty correction amplifying means includes:

a second differential amplifying unit which receives an output from the fine delay line;

a first current mirroring unit for mirroring a current outputted from a sub output terminal of the second differential amplifying unit;

a second current mirroring unit for mirroring a current outputted from a main output terminal of the second differential amplifying unit;

a first cascade load and a second cascade load connected between the first current mirroring unit and the second current mirroring unit; and a first capacitor and a second capacitor for generating the duty control voltage by charging an output current from the first mirroring unit and the second mirroring unit.

9. The analog delay locked loop device as recited in claim 5, wherein each of the first multiplexer and the second multiplexer includes:

a plurality of selection units having a seventh MOS transistor, a first MOS transistor and a second MOS transistor pair; and a second load unit connected to the selection units, wherein, a gate of the seventh MOS transistor receives a bias voltage, gates of the first MOS transistor receive the normal multi phase clock signal pairs in the first multiplexer and receives the dummy multi phase clock signal pairs in the second multiplexer, gates of the second MOS transistor receive the phase selection signal.

10. The analog delay locked loop device as recited in claim 8, wherein each capacitance of the first capacitor and the second capacitor has the same capacitance.

11. The analog delay locked loop device as recited in claim 1, wherein the reference clock signal and the internal clock signal are in phase.

12. The analog delay locked loop device as recited in claim 11, wherein the internal clock signal is used as the reference clock signal.

13. The analog delay locked loop device as recited in claim 1, wherein the reference control means includes:

a phase detector to compare a phase of the reference clock signal with that of the last clock signal pair of the normal multi clock signal pairs;

a charge pump receives an output from the phase detector as its input; and a loop filter to receive an output from the charge pump having a capacitor.

* * * * *